(12) United States Patent
Chang et al.

(10) Patent No.: US 8,901,678 B2
(45) Date of Patent: Dec. 2, 2014

(54) LIGHT-ASSISTED BIOCHEMICAL SENSOR

(75) Inventors: Liann-Be Chang, Tao-Yuan (TW);
Chao-Sung Lai, Taoyuan (TW);
Po-Chuan Chen, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 101 days.

(21) Appl. No.: 12/970,583

(22) Filed: Dec. 16, 2010

(65) Prior Publication Data

US 2012/0153407 A1  Jun. 21, 2012

(51) Int. Cl.
H01L 29/78    (2006.01)
H01L 31/0216  (2014.01)
H01L 31/173   (2006.01)

(52) U.S. Cl.
CPC ........ *H01L 31/173* (2013.01); *H01L 31/02161* (2013.01)
USPC .................................. 257/414; 257/E27.122

(58) Field of Classification Search
None
See application file for complete search history.

(56) References Cited

U.S. PATENT DOCUMENTS

| | | | |
|---|---|---|---|
| 6,087,702 A | 7/2000 | Chang et al. | |
| 2004/0014240 A1* | 1/2004 | Takeguchi et al. | 436/518 |
| 2005/0063870 A1* | 3/2005 | Fukushima et al. | 422/82.05 |
| 2012/0062113 A1* | 3/2012 | Tang et al. | 315/32 |

OTHER PUBLICATIONS

Chang et al, "Stack Layer $SiO_2/Gd_2O_3/SiO_2$/GaAs pH-Sensitive Electrolyte Insulator Semiconductor Capacitors and Their Anneal Temperature Dependency" Journal of The Electrochemical Society, Sep. 23, 2010, 157(11) G234-239.
Hafeman et al, "Light-addressable potentiometric sensor for biochemical systems" *Science*, 240, 1182, May 27, 1988.
Owicki et al, "The Light-addressable potentiometric sensor: principles and biological application" *Annu. Rev. Biophys. Biomal. Struct.*, 1994, 23, 87.
Seki et al, "Novel sensors for potassium, calcium and magnesium ions based on a silicon transducer as a light-addressable potentiometric sensor" *Anal. Chim. Acta*, 1999, 382, 131.
Yu et al, "The Hybrid K+Ca2+Sensor Based on Laser Scanned Silicon Transducer for Multi-component Analysis" in *Proceedings of the International Congress on Analytical Sciences*, Japan Society for Analytical Chemistry, Tokyo, Sep. 13, 2001, 777.
Yu et al, "Photocurable membranes for ion-selective light-addressable potentiometric sensor" *Sens. Actuators B*, Feb. 21, 2002, 85, 79.
Wang et al, "The enhancement of InGaAs Schottky barrier height by the addition of Pr2O3 and In2O3 in the liquid phase epitaxy" *Appl Phys. Lett.*, May 12, 1997, 70, 2571.

(Continued)

*Primary Examiner* — Marvin Payen
(74) *Attorney, Agent, or Firm* — Muncy, Geissler, Olds & Lowe, P.C.

(57) ABSTRACT

A light-assisted biochemical sensor based on a light addressable potentiometric sensor is disclosed. The light-assisted biochemical sensor comprises a semiconductor substrate and a sensing layer, which are used to detect the specific ion concentration or the biological substance concentration of a detected solution. Lighting elements fabricated directly on the back surface of the semiconductor substrate directly illuminate the light to the semiconductor substrate, so as to enhance the photoconduction property of the semiconductor substrate. And then, the hysteresis and the sensing sensitivity of the light-assisted biochemical sensor are respectively reduced and improved. In addition, due to its characteristics of integration, the light-assisted biochemical sensor not only reduces the fabrication cost but also has portable properties and real-time detectable properties. As a result, its detection range and the application range are wider.

2 Claims, 5 Drawing Sheets

(56) References Cited

OTHER PUBLICATIONS

Chiu et al, "Comprehensive Study of GaAs MOSFETs Using Gadolinium Oxide and Praseodymium Oxide Layers" *J. Electrochem. Soc.*, Oct. 8, 2008, 155,H955.

Fang et al, "Effect of Surface Passivation Removal on Planarization Efficiency in Cu Abrasive-Free Polishing" *J. Electrochem. Soc.*, Nov. 22, 2005, 153, G44.

\* cited by examiner

LIGHT-ASSISTED BIOCHEMICAL SENSOR

BACKGROUND OF THE INVENTION

1. Field of the Invention

The present invention relates to a biochemical sensor, particularly to a light-assisted biochemical sensor based on a light addressable potentiometric sensor.

2. Description of the Related Art

Refer to FIG. 1. The light addressable potentiometric sensor (LAPS) is a biochemical sensor based on the photovoltaic effect of semiconductor.

FIG. 1 is a diagram schematically showing the pH measurement system of the traditional light addressable potentiometric sensor. The LAPS mainly comprises a semiconductor substrate 101, and an oxide layer 102 or a nitride layer formed on the semiconductor substrate 101. An external light source 104 is located behind the back surface of the semiconductor substrate 101. When a light with a wavelength is emitted to a semiconductor, the semiconductor absorbs the photons such that the jumping of atoms from valance band to the conduction band will produce pairs of electrons and holes. In general, the electron-hole pair will be rapidly recombined, and then the current can not be detected by an external circuit. If the LAPS is biased at a reversed bias (N-type silicon is biased at a negative voltage and P-type silicon is biased at a positive voltage), a depletion region is generated in the semiconductor, and the electron-hole pair close to the depletion region is separated to the two sides of the depletion region before they have a chance to recombine with each other. If the intensity-adjusting light source is used to illuminate the light, the alternate variations of the electron-hole pair will occur. Then, the photocurrent is detected in the external circuit. The photocurrent variations correspond to the responses of the sensing region of the LAPS. As a result, the specific ion concentration or the biological substance concentration of an electrolyte is detected by the photocurrent variation due to the potential variation of the sensing region.

Since the LAPS can continuously detect a plurality of parameters and have the advantages of high sensitivity, high stability, and high input resistance, the application range thereof is very wide. However, the traditional LAPS detects the electrolyte concentration in cooperation with the external light source, whereby the measurement system of the LAPS has larger volume and the measuring process is more complicated. These disadvantages limit the convenience and practicability of the LAPS.

SUMMARY OF THE INVENTION

A primary objective of the present invention is to provide a light-assisted biochemical sensor, wherein lighting elements are integrated with a light addressable potentiometric sensor (LAPS), hereby raising the photoconduction properties of the light addressable potentiometric sensor, thus the purposes of high sensitivity and small error can be achieved. Further, due to the integrated characteristics, the measurement system volume and fabrication cost of the LAPS are reduced. And the light-assisted biochemical sensor has the following advantages: an easy-carrying property, a real-time detectable property, a convenient-used property, an easy-operated property, wide application range, and wide detection range. The light-assisted biochemical sensor can solve the shortcomings of the prior art in a wide and broad scope.

To achieve the abovementioned objective, the present invention provides a light-assisted biochemical sensor based on a LAPS. A sensing layer is deposited on the front surface of the semiconductor substrate and the lighting elements are directly fabricated on the back surface of the semiconductor substrate. All elements are sealed and protected by a package material, and only a sensing region is exposed. As a result, in operations, all elements are protected from an acid-base solution. When the lighting elements emit lights to the silicon substrate, the photoconduction properties of the silicon substrate are enhanced. Since the surface potential of the sensing layer is affected by the ion concentration or the biological substance concentration of the solution, the photocurrent varies with an external bias. Therefore, the ion concentration or the biological substance concentration of the solution is obtained by detecting the photocurrent, hereby achieving the biochemical sensing purpose.

Below, the embodiments are described in detail in cooperation with the drawings to make easily understood the characteristics, technical contents and accomplishments of the present invention.

DETAILED DESCRIPTION OF THE INVENTION

Figure 1:
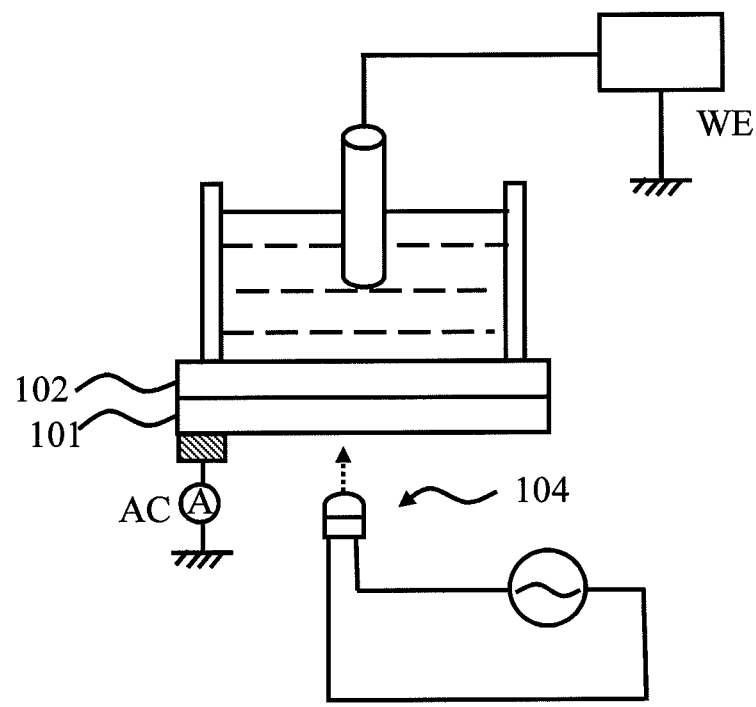
FIG. 1 is a diagram schematically showing the pH measurement system of the traditional light addressable potentiometric sensor.
Figure 2:
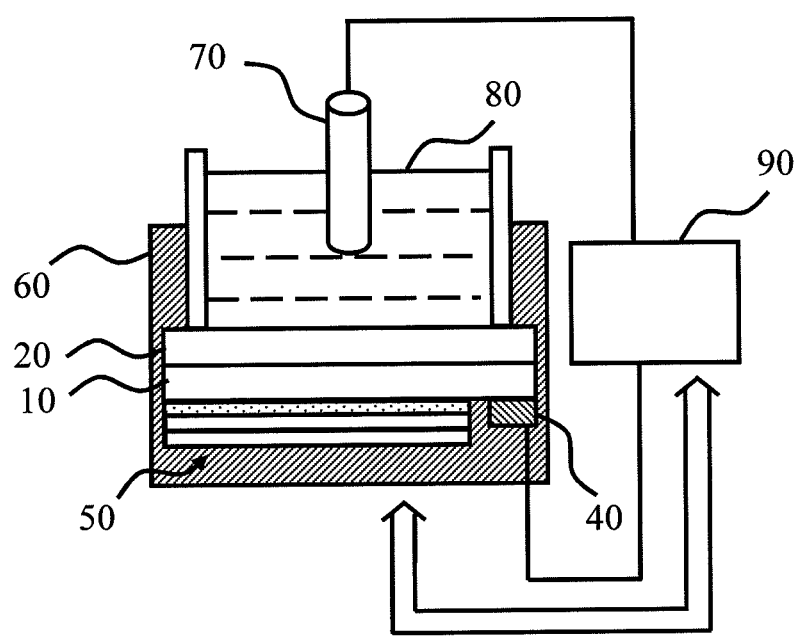
FIG. 2 is a diagram schematically showing the pH measurement system of the light-assisted biochemical sensor according to an embodiment of the present invention.

Refer to FIG. 2, which is a diagram schematically showing the measurement system of the light-assisted biochemical sensor according to an embodiment of the present invention. The light-assisted biochemical sensor is used to detect the pH value of the electrolyte.

In this embodiment, the light-assisted biochemical sensor comprises a semiconductor substrate 10, a sensing layer 20, an active electrode 40, and at least one lighting element 50. In the fabrication process, the P-type semiconductor substrate 10 with direct band gap or the N-type semiconductor substrate 10 with direct band gap is adopted, such as a GaAs substrate. In the airtight reactive chamber of the physical vapor deposition system or the chemical vapor deposition system, the sensing layer 20 is deposited on the front surface of the semiconductor substrate 10 using the adapt gas, pressure, and power, wherein the sensing layer 20 comprises $SiO_2$, $Si_3N_2$, $Ta_2O_5$, or REO (rare earth oxide). The sensing layer 20 can be followed by anneal for a period of time whereby the film structure of the sensing layer 20 is compacted. Then, the sensing layer 20 can detect the electrolyte well. The sensing layer 20 has a sensing region defined by the yellow light manufacturing process and is used to detect the ion concentration of a solution. In addition, an Al layer used as the active electrode 40 is deposited on the back surface of the semiconductor substrate 10. The lighting element 50 is fabricated directly on the back surface of the semiconductor substrate 10, and the lighting surface of the lighting element 50 faces the back surface of the semiconductor substrate 10.

Wherein the lighting element 50 is a light-emitting-diode (LED), an organic light-emitting-diode (OLED), a laser diode (LD), or an electroluminescence (EL) device, and a control element 90 can control the lighting element 50 to emit light. Finally, the semiconductor substrate 10, the sensing layer 20, the active electrode 40, and the lighting element 50 are sealed by a package material 60 such as epoxy resin, and only the sensing region of the sensing layer 20 is exposed. Then, in operations, the package material 60 can protect the biochemical sensor from the damage of the acid-base solution.

In the present embodiment, in detecting the ion concentration or the biological substance concentration, the detected solution 80 used as the electrolyte is put into the light-assisted biochemical sensor, and a reference electrode 70 is immersed in the detected solution 80, wherein the reference electrode 70 can provide a stable potential. When the lighting element 50 illuminates a light on the back surface of the semiconductor substrate 10 and the semiconductor substrate 10 is biased at a DC bias, the pH value of the electrolyte contacting the sensing layer 20 will vary. The pH variation results in the surface potential variation of the sensing layer 20. Then, the photocurrent variation is generated. As a result, the pH value of the electrolyte is detected by measuring the variation of the photocurrent flowing through the active electrode and the reference electrode.

Figure 3:
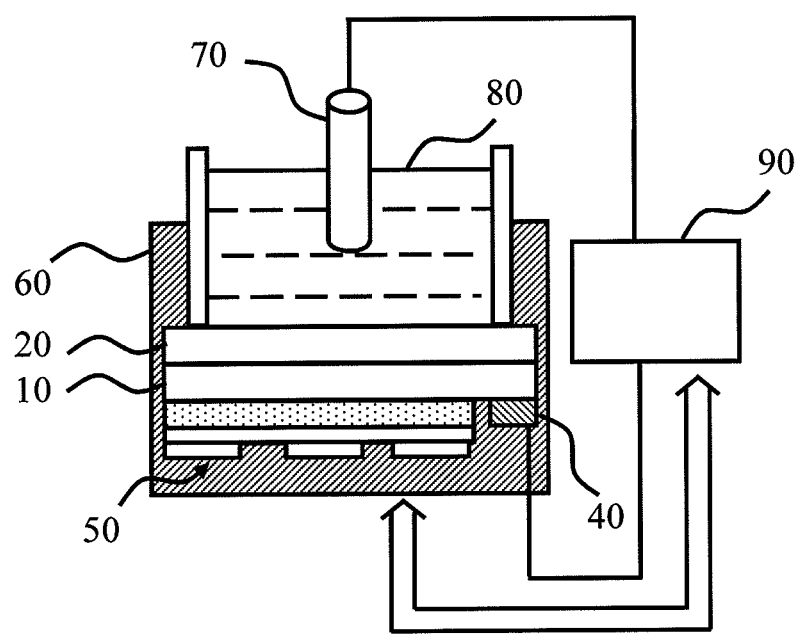
FIG. 3 is a diagram schematically showing the light-assisted biochemical sensor having the lighting element array according to an embodiment of the present invention.

Besides, refer to FIG. 3, which is a diagram schematically showing the light-assisted biochemical sensor having lighting element array according to an embodiment of the present invention. In this embodiment, the present invention comprises a plurality of lighting elements 50 arranged into an array. The control element 90 can control the lighting elements 50 illuminate the different regions of the back surface of the semiconductor substrate 10. Therefore, the specific ion concentration or the biological substance concentration of the solution can be detected by detecting the photocurrent variation as caused by the surface potential variation of the sensing layer 20 corresponding to different light-illuminating regions.

Figure 4:
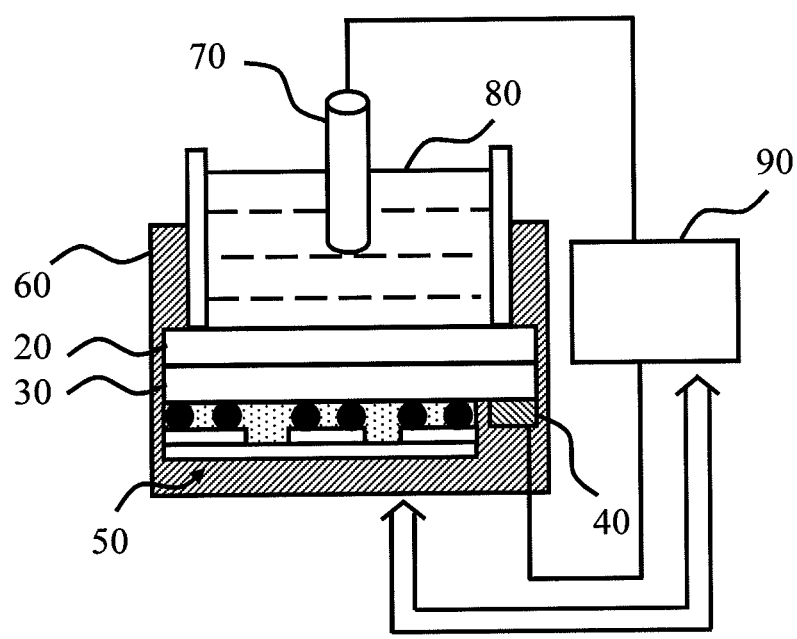
FIG. 4 is a diagram schematically showing the light-assisted biochemical sensor having the lighting elements fabricated with the flip-chip technology.
Figure 5:
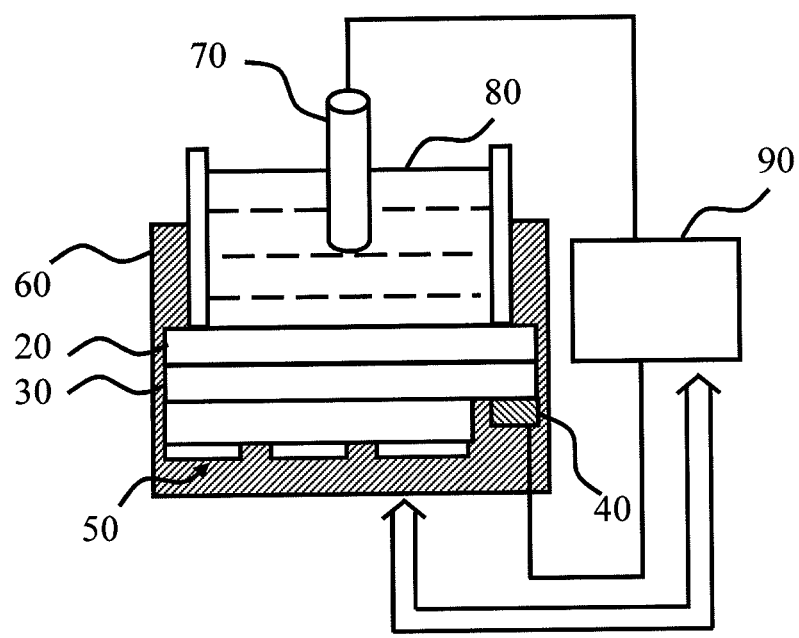
FIG. 5 is a diagram schematically showing the light-assisted biochemical sensor having the lighting elements fabricated with the wafer-bonding technology.

In addition, refer to FIG. 4, the P-type semiconductor substrate 10 with indirect band gap or the N-type semiconductor substrate 30 with indirect band gap is adopted. The lighting elements 50 are directly fabricated on the back surface of the semiconductor 30 using the flip-chip technology. Besides, refer to FIG. 5, the lighting elements 50 are fabricated directly on the back surface of the semiconductor 30 using the wafer bonding technology.

In conclusion, the present invention provides a light-assisted biochemical sensor based on the light addressable potentiometric sensor (LAPS). The light-assisted biochemical sensor is modularized with the lighting element to enhance the photoconduction properties of the semiconductor substrate. Then, the detection sensitivity and performance of the sensor are improved.

Further, the present invention can not only greatly reduce the volume of the measurement system but also provide the sensing element having the high sensitivity and the low cost with the easier fabrication process. The present invention has the following advantages: a portable property, a real-time detectable property, and a convenient-operating property, etc. The application range of the present invention is very wide.

The embodiments described above are only to exemplify the present invention but not to limit the scope of the present invention. Therefore, any equivalent modification or variation according to the shape, structures, characteristics and spirit disclosed in the present invention is to be also included within the scope of the present invention.

What is claimed is:

1. A light-assisted biochemical sensor comprising:
   a composite semiconductor substrate having a front surface and a back surface, wherein said composite semiconductor substrate is a P-type semiconductor substrate with direct band gap or an N-type semiconductor substrate with direct band gap;
   a sensing layer comprising REO (rare earth oxide), formed on said front surface of said composite semiconductor substrate with a chemical vapor deposition method and having a specify sensing region to detect a specific continuous ion concentration distribution or a continuous biological substance concentration distribution of a detected solution contacting said sensing region; and
   at least one matrix array lighting element with a lighting surface thereof directly fabricated and matched on said back surface of said composite semiconductor substrate and illuminating a light on said composite semiconductor substrate to enhance a detecting distribution sensitivity of said sensing region; and
   a control element control selectively the lighting element illuminate the different regions of the back surface of the composite semiconductor substrate.

2. The light-assisted biochemical sensor according to claim 1, wherein said lighting element is fabricated directly with a wafer-bonding technology or a flip-chip technology, such that said lighting surface is disposed on said back surface of said composite semiconductor substrate.

* * * * *